United States Patent [19]
Furuyama

[11] Patent Number: 4,841,483
[45] Date of Patent: Jun. 20, 1989

[54] SEMICONDUCTOR MEMORY
[75] Inventor: Tohru Furuyama, Tokyo, Japan
[73] Assignee: Kabushiki Kaisha Toshiba, Kanagawa, Japan
[21] Appl. No.: 130,568
[22] Filed: Dec. 9, 1987
[30] Foreign Application Priority Data Dec. 15, 1986 [JP]  Japan .................. 61-298398

[51] Int. Cl.$^4$ ............................................. G11C 13/00
[52] U.S. Cl. ..................... 365/189.07; 365/182; 365/202
[58] Field of Search ............... 365/182, 189, 190, 202, 365/230, 207

[56] References Cited
PUBLICATIONS

Aoki et al., "A 16-Levels/Cell Dynamic Memory," IEEE International Solid-State Circuits Conference, ISSCC Digest of Technical Papers, pp. 246-247, Feb. 15, 1985.

Primary Examiner—Terrell W. Fears
Attorney, Agent, or Firm—Finnegan, Henderson, Farabow, Garrett and Dunner

[57] ABSTRACT

The invention provides a semiconductor memory having a plurality of memory cells and a bit line connected to the memory cells comprising, the bit line being formed of a plurality of sub-bit lines, switch means for interconnecting and disconnecting the sub-bit lines, reference potential means for storing reference potentials, and sense amplifier means for comparing the output of an addressed memory cell with the reference potentials, whereby the memory is capable of storing n-valued data using n different storage potentials.

12 Claims, 3 Drawing Sheets

| MEMORY POTENTIAL OF MEMORY CELL | BL1a (BL1a) | BL1b (BL1b) | BL1c (BL1c) | D1 | D2 |
|---|---|---|---|---|---|
| 0 | L (H) | L (H) | L (H) | L | L |
| $\frac{1}{3}$Vcc | H (L) | L (H) | L (H) | H | L |
| $\frac{2}{3}$Vcc | H (L) | H (L) | L (H) | L | H |
| Vcc | H (L) | H (L) | H (L) | H | H |

SEMICONDUCTOR MEMORY

BACKGROUND OF THE INVENTION

1. Field of the Invention

This invention relates to a random access semiconductor memory capable of both reading and writing. In particular, the invention relates to a large capacity dynamic semiconductor memory.

2. Description of the Related Art

With the advance in techniques for making smaller semiconductor memory elements, capacities have been progressively increased up to the present. However, recently the pace of shrinking memory element has slowed, and inevitably the rate at which capacities can be increased using binary data memory cells as used up to the present has slowed. This suggests the method whereby one cell is used to store a multivalued data. In this type of memory, a single memory cell does not store two valued binary data (one bit), but rather stores four values (two bit) or eight valued (three bit) data. In other words, in the case of n-valued memory, 1/n cells hold the same amount of data as in the conventional binary data system.

An example of this kind of multivalued data memory is described in "A16-levels/cell dynamic memory", pages 246-247 of Digest of Technical Papers ISSCC, 1985, or as disclosed in Japanese Patent Laying Open Specification Sho 50-62233 (1975), in which a set of digital signals are collected together, converted to an analogue signal, and that analogue signal is stored.

However, in the above described prior art, data is read out sequentially over a number of cycles, so that there is the drawback that access times are long. For example, of the above prior art, the former requires access times between 50 microseconds and 100 microseconds, and this value is between 100 and 1,000 times that for a normal binary dynamic RAM.

Further, in the former example it is necessary to control the potential of a word line in a stepwise fashion, and considerably difficult circuitry techniques are required for this level generation. Moreover, in the latter example, in order to produce write levels for a bit line, a large intermediate potential generation circuit is required for the drive current, and in this case also high level circuitry techniques are required.

Thus in this prior art, the principal objective of dynamic RAM design which is lower cost, is not met.

A semiconductor memory using this type of conventional multivalued data storage method has defects including long access time and high cost of manufacture.

SUMMARY OF THE INVENTION

An object of this invention is to provide a semiconductor memory using a multivalued data storage method such that access times are similar to those using a conventional binary data storage method, circuit technology which is complicated and requires highly accurate control is not required, and realisation is possible adequately using circuit technology established for semiconductor memories.

This invention provides a semiconductor memory having a plurality of memory cells and a bit line connected to the memory cells, the bit line being formed of a plurality of sub-bit lines, switch means for interconnecting and disconnecting the sub-bit lines, reference potential means for storing reference potentials, and sense amplifier means for comparing the output of an addressed memory cell with the reference potentials, whereby the memory is capable of storing n-valued data using n different storage potentials.

BRIEF DESCRIPTION OF THE DRAWINGS

Embodiments of this invention will now be described by way of example only and with reference to the accompanying drawings, in which.

DETAILED DESCRIPTION OF THE PREFERRED EMBODIMENTS

In the semiconductor memory of this invention, one of n different data values can be stored in each memory cell as one of n different voltage levels. Furthermore, a bit line is divided into $(n-1)$ sub-bit lines, and each sub-bit line is connected through a switch element, whereby the $(n-1)$ sub-bit lines are selectively connected or disconnected. Then when the data is to be read out, with the $(n-1)$ sub-bit lines in the connected state, the memory potential of one memory cell is read out, after which the switch elements are set to the non-conducting state, and the bit line is separated into $(n-1)$ sub-bit lines. Next the voltage on each of the $(n-1)$ sub-bit lines is detected using $(n-1)$ sense amplifiers having different standard voltages. On the other hand, when data is to be written, with the $(n-1)$ sub-bit lines in the separate state, each sub-bit line is supplied with a voltage corresponding to the data to be written, and then the switch elements are put into the conducting state, and the $(n-1)$ sub-bit lines are connected together. Thereafter, the bit-line potential is determined by capacitative division of the potential of each of the $(n-1)$ sub-bit lines, and this potential is written to the selected memory cell.

Figure 1:
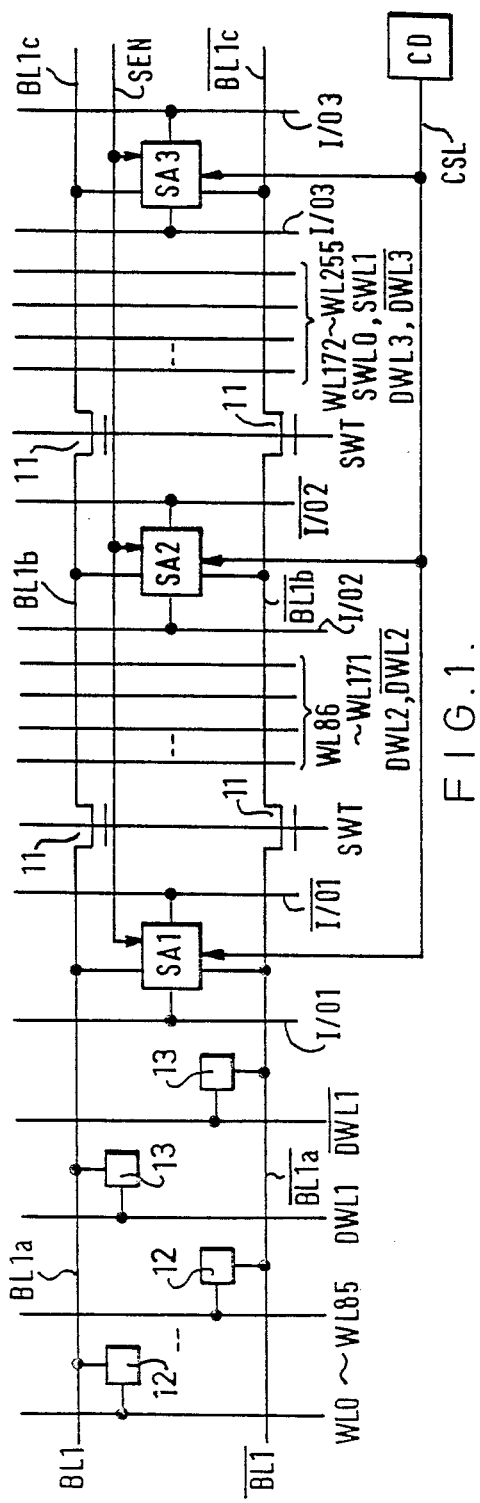
FIG. 1 is a circuit diagram showing the structure of one embodiment of the semiconductor memory of this invention.

FIG. 1 is a circuit diagram of an embodiment of the invention in a dynamic RAM semiconductor memory using a four valued data (two bit) storage method. In this memory, for example, 256 rows are allocated to one column, and FIG. 1 shows one column only.

In the drawing, BL1 and $\overline{BL1}$ are a bit line pair, and this bit line pair BL1 and $\overline{BL1}$ is divided into respectively three sub-bit lines BL1a, BL1b and BL1c and $\overline{BL1a}$, $\overline{BL1b}$ and $\overline{BL1c}$, and each of the sets of three sub-bit lines BL1a, BL1b, and BL1c and $\overline{BL1a}$, $\overline{BL1b}$ and $\overline{BL1c}$ are each connected by N channel MOS transistors 11. A control signal SWT is supplied to the gate of each of these transistors 11.

Intersecting with the direction of extension of the bit line pair BL1 and $\overline{BL1}$ are provided 256 word lines WL0 to WL255, two spare word lines SWL0 and SWL1, three pairs of dummy word lines DWL1, $\overline{DWL1}$, DWL2, $\overline{DWL2}$, DWL3 and $\overline{DWL3}$, and three pairs of data input/output lines I/O1, $\overline{I/O1}$, I/2, $\overline{I/O2}$, I/O3 and $\overline{I/O3}$. Of these, 86 word lines WL0 to WL85, two dummy word lines DWL1, $\overline{DWL1}$, and one pair of data input/output lines I/O1 and $\overline{I/O1}$ belong to one pair of sub-bit lines BL1a and $\overline{BL1a}$; 86 word lines WL86 to WL171, two dummy word lines DWL2, $\overline{DWL2}$, and one pair of data input/output lines I/O2 and $\overline{I/O2}$ belong to the pair of sub-bit lines BL1b and $\overline{BL1b}$, and then 84 word lines WL172 to WL255, two spare word lines SWL0 and SWL1, two dummy word lines DWL3 and $\overline{DWL3}$ and one pair of data input/output lines I/O3 and $\overline{I/O3}$ belong to the pair of sub-bit lines BL1c and $\overline{BL1c}$.

A memory cell 12 is provided at the intersection of each of these word lines WL and spare word lines SWL with one of the sub-bit lines BL1a, BL1b, BL1c, $\overline{BL1a}$, $\overline{BL1b}$, $\overline{BL1c}$. Moreover, at the intersections of the dummy word lines DWL and $\overline{DWL}$ with one of the sub-bit lines BL1a, BL1b, BL1c, BL1a, BL1b, BL1c are provided dummy memory cells 13.

Next for each pair of sub-bit lines is provided a sense amplifier SA1, SA2 and SA3, respectively. These sense amplifiers SA1, SA2, and SA3 are connected across the corresponding respective sub-bit lines, and also are connected respectively to the corresponding one of the three pairs of data input/output lines I/O and $\overline{I/O}$. These sense amplifiers SA1, SA2 and SA3 are each provided with two different control signals SEN and CSL. When one of the control signals SEN is, for example, at high level, they carry out the action of a sense amplifier. When the other control signal CSL is, for example, at high level, they output the sensed data to the corresponding data input/output lines I/O and $\overline{I/O}$ and also accept write data applied to the corresponding data input/output lines I/O and $\overline{I/O}$ and transfer it to the corresponding sub-bit lines. The control signal CSL is output from a column decoder CD.

Although not shown in the drawing, a load circuit for each bit line pair, a data output circuit which outputs two bits of data based on the output of the sense amplifiers SA1, SA2 and SA3 when data is being read out, and a data write circuit which produces write data for the sub-bit lines based on two bits of write data from the outside when data is to be written are provided.

Figure 2:
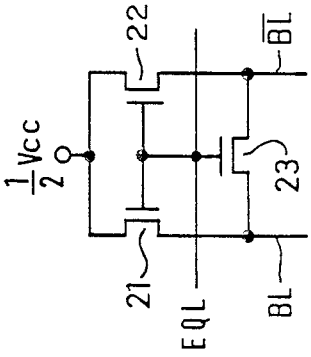

FIG. 2 is a circuit diagram showing the structure of a load circuit for a bit line pair in the circuit of the above embodiment. In this load circuit, between one bit line BL and a point of application of one half of the supply voltage Vcc, ($\frac{1}{2}$)Vcc is inserted a precharge N channel MOS transistor 21, and between the other bit line $\overline{BL}$ and point of application of one half of the supply voltage Vcc, ($\frac{1}{2}$)Vcc is inserted a precharge N channel MOS transistor 22, and then between the bit lines BL and $\overline{BL}$ is inserted an equalising N channel MOS transistor 23. The gates of the transistors 21, 22 and 23 are supplied in parallel with the control signal EQL.

Figure 3A:
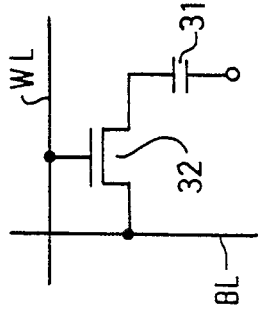
FIGS. 2 to 5 are circuit diagrams showing in detail respective portions of the above embodiment circuit diagram.
Figure 3B:
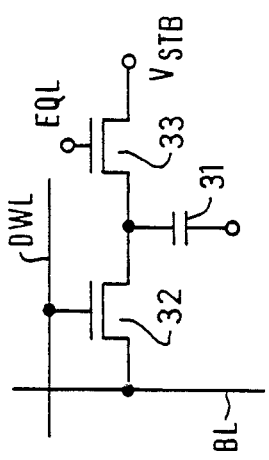

FIG. 3(a) and (b) are circuit diagram showing the actual structure of a memory cell 12 and a dummy memory cell 13 in the circuit diagram of the above embodiment, respectively. These memory cell and dummy memory cell are, as shown in the drawings, constituted of a data storage capacitor 31 and an N channel MOS transistor 32 for selecting the capacitor 31; the transistor 32 gate is connected to the corresponding word line WL or spare word line SWL or dummy word line DWL, or $\overline{DWL}$, and the drain on the opposite side from the capacitor 31 is connected to a bit line BL or $\overline{BL}$. Dummy cell additionally has a transistor 33, which acts as write gate for precharging the standard potential to the dummy cell capacitor. When as described above the bit line BL is divided into three sub-bit lines, if the capacitance of the capacitor 31 in the memory cell 12 is Cs, then the capacitance of the capacitor 31 in a dummy cell 13 is set to be approximately ($\frac{1}{3}$)Cs. Furthermore, the four values of the potential to be stored in a memory cell 12 are, if the power supply voltage is Vcc, for example 0, ($\frac{1}{3}$)Vcc, ($\frac{2}{3}$)Vcc and Vcc. At this time, a potential of (1/6)Vcc is already stored in the dummy cell 13 connected to the sub-bit line pair BL1c and $\overline{BL1a}$, a potential of ($\frac{1}{2}$)Vcc is already stored in the dummy cell 13 connected to the sub-bit line pair BL1b and $\overline{BL1b}$, and a potential (5/6)Vcc is already stored in the dummy cell 13 connected to the sub-bit line pair BL1a and $\overline{BL1c}$, and these potentials are supplied as standard potentials to the sense amplifiers SA1, SA2 and SA3 respectively when data is to be read out from the memory cells 12. The potentials (1/6)Vcc, ($\frac{1}{2}$)Vcc and (5/6)Vcc already stored in dummy cells 13 are formed by potential generating circuits not shown in the drawing.

Figure 4:
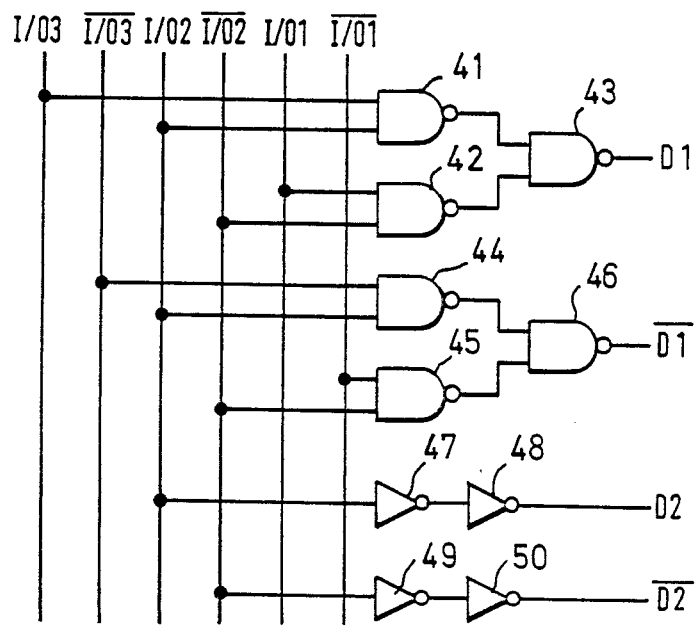

FIG. 4 is a circuit diagram showing the structure of a data output circuit in the circuit of the above embodiment. On the three pairs of data input/output lines I/O1, $\overline{I/O1}$, I/O2, $\overline{I/O2}$, I/O3 and $\overline{I/O3}$ connected to the sense amplifiers SA1, SA2 and SA3, the data from I/O3 and I/O2 is supplied to the NAND gate 41, the data from I/O1 and $\overline{I/O2}$ are supplied to the NAND gate 42, and the outputs of the NAND gates 41 and 42 are supplied to a NAND 43. The data from $\overline{I/O3}$ and I/O2 are supplied to a NAND gate 44, and the data from $\overline{I/O1}$ and $\overline{I/O2}$ are connected to a NAND gate 45, and the outputs of the NAND gates 44 and 45 are supplied to a NAND gate 46. The data from I/O2 is supplied to the first stage of two inverters 47 and 48 connected in series, and the data from $\overline{I/O2}$ is supplied to the first stage of two inverters 49 and 50 connected in series. Of two bits of read out data, D1 is output from the NAND gate 43, $\overline{D1}$ is output from the NAND gate 46, D2 is output from the inverter 48, and $\overline{D2}$ is output from the inverter 50.

Figure 5:
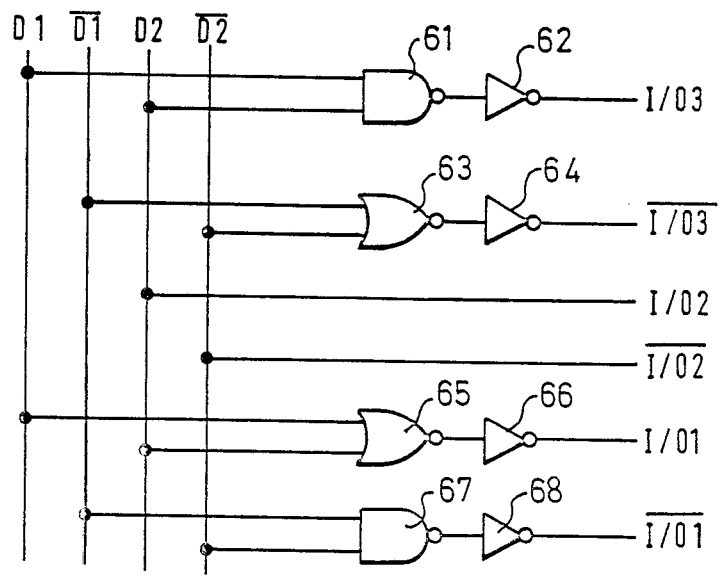

FIG. 5 is a circuit diagram showing the structure of a data write circuit in the circuit diagram of the above embodiment. Of two bits of write data supplied from outside, D1, $\overline{D1}$, D2 and $\overline{D2}$, D1 and D2 are supplied to a NAND gate 61, and the output of this NAND gate 61 is supplied to an inverter 62. $\overline{D1}$ and $\overline{D2}$ are supplied to a NOR gate 63, and the output of this NOR gate is supplied to an inverter 64. Furthermore, $\overline{D1}$ and $\overline{D2}$ are supplied to a NOR gate 65, and the output of this NOR gate 65 is supplied to an inverter 66. Furthermore, D1 and D2 are supplied to a NAND gate 67, and the output of this NAND gate 67 is supplied to an inverter 68. The output of the inverters 62 and 64 are supplied to the data input/output lines I/O3 and $\overline{I/O3}$ respectively, the signals D2 and $\overline{D2}$ are supplied unchanged to the input/output lines I/O2 and $\overline{I/O2}$ respectively, and the outputs of the inverters 66 and 68 are supplied respectively to the data input/output lines I/O1 and $\overline{I/O1}$.

Next the operation of a memory constructed as described above is explained with reference to the timing chart of FIG. 6. Firstly, in the case that data is to be read out, then each memory cell 12 will already have stored in it one of the four potentials O, ($\frac{1}{3}$)Vcc, ($\frac{2}{3}$)Vcc and Vcc.

Firstly, the control signal EQL goes to high level, and the transistors 21, 22 and 23 in FIG. 2 are conducting. At this point, the control signal SWT also goes high, and the transistors 11 in FIG. 1 are conducting, and the sets of three sub-bit lines BL1a, BL1b and BL1c and $\overline{BL1a}$, $\overline{BL1b}$ and $\overline{BL1c}$ are each connected into single lines BL1 and $\overline{BL1}$. The high level voltage of the control signal SWT is preferably set higher than the bit line high level voltage Vcc in order that the conducting resistance of the transistors 11 is sufficiently small. As a result, all of the sub-bit lines BL1a, $\overline{BL1a}$, BL1b, $\overline{BL1b}$, BL1c and $\overline{BL1c}$ are precharged to a potential of ($\frac{1}{2}$)Vcc.

Next the control signal EQL is lowered to the low level, and precharging of the bit lines is completed. After the completion of precharging, one of the 256 word lines WL is selected based on an address from outside, and is raised to the high level. Thereby, the one memory cell 12 connected to the selected word line WL is activated, and the stored potential is read out to the bit line BL1 or $\overline{BL1}$. The voltage read out from the memory cell 12 is transmitted to the set of three sub-bit lines BL1a, BL1b and BL1c or $\overline{BL1a}$, $\overline{BL1b}$ and $\overline{BL1c}$, connected together as one line, but here it will be taken as being transmitted to the sub-bit lines BL1a, BL1b and BL1c, for example.

Next the control signal SWT is lowered to the low level, and the transistors 11 in FIG. 1 become non-conducting; the bit lines BL1 and $\overline{BL1}$ are each divided into three sub-bit lines BL1a, BL1b and BL1c and $\overline{BL1a}$, $\overline{BL1b}$ and $\overline{BL1c}$. After separation, each of the sub-bit lines BL1a, BL1b and BL1c maintain the same potential without changing. Next corresponding to the word line WL selected, for each pair of dummy word lines DWL1, $\overline{DWL1}$, DWL2, $\overline{DWL2}$, DWL3 and $\overline{DWL3}$, respectively $\overline{DWL1}$, $\overline{DWL2}$ and $\overline{DWL3}$ are simultaneously selected, and driven to the high level. Thereby, the dummy cells 13 are activated. In the case that the memory cell 12 connected to the selected word line WL is connected to the bit line BL1, then the corresponding DWL1, DWL2 and DWL3 respectively are selected. Here, since a potential of (1/6)Vcc is already stored in the dummy cell 13 connected to the sub-bit lines BL1c and $\overline{BL1a}$, when the dummy cell 13 is activated, a potential of (1/6)Vcc is read out on the sub-bit line $\overline{BL1a}$. In the same way, a potential of ($\frac{1}{2}$)Vcc is read out on the sub-bit line $\overline{BL1b}$, and a potential of (5/6)Vcc is read out on the sub-bit line $\overline{BL1c}$.

After the potentials stored in the dummy cells 13 have been read out to the sub-bit lines $\overline{BL1a}$, $\overline{BL1b}$ and $\overline{BL1c}$ respectively, the control signal SEN is set to high level. Thereby, activation of the three sense amplifiers SA1, SA2 and SA3 is begun. In other words, the sense amplifier SA1 will amplify the potential difference between the sub-bit lines BL1a and $\overline{BL1a}$. In the same way, the sense amplifiers SA2 and SA3 will amplify the potential differences between the bit lines BL1b and $\overline{BL1b}$ and BL1c and $\overline{BL1c}$, respectively. Next the control signal CSL output from the column decoder CD is set to high, and the data of each of the sub-bit line pairs amplified by the sense amplifiers SA1, SA2 and SA3 is output to the data input/output line pairs I/O1, $\overline{I/O1}$, I/O2, $\overline{I/O2}$, O/O3 and $\overline{I/O3}$.

In this case, when the stored potential in the selected memory cell 12 is 0, this value is lower than all of the three potentials (1/6)Vcc, ($\frac{1}{2}$)Vcc and (5/6)Vcc stored in the dummy cells 13, and therefore after amplification by the sense amplifiers SA1, SA2 and SA3, the sub-bit lines BL1a, BL1b and BL1c will each be low level, and the sub-bit lines $\overline{BL1a}$, $\overline{BL1b}$ and $\overline{BL1c}$ will each be high level. If the potential stored in the selected memory cell 12 is ($\frac{1}{3}$)Vcc, then this value will be higher than the potential (1/6)Vcc but lower than the potentials ($\frac{1}{2}$)Vcc and (5/6)Vcc, stored in the dummy cells 13, as a result of which after amplification by the sense amplifiers SA1, SA2 and SA3, the sub-bit line BL1a will be high level, and $\overline{BL1a}$ will be low level, BL1b and BL1c will each be low level, and the sub-bit lines $\overline{BL1b}$ and $\overline{BL1c}$ will each be high level.

Figures 6, 7:
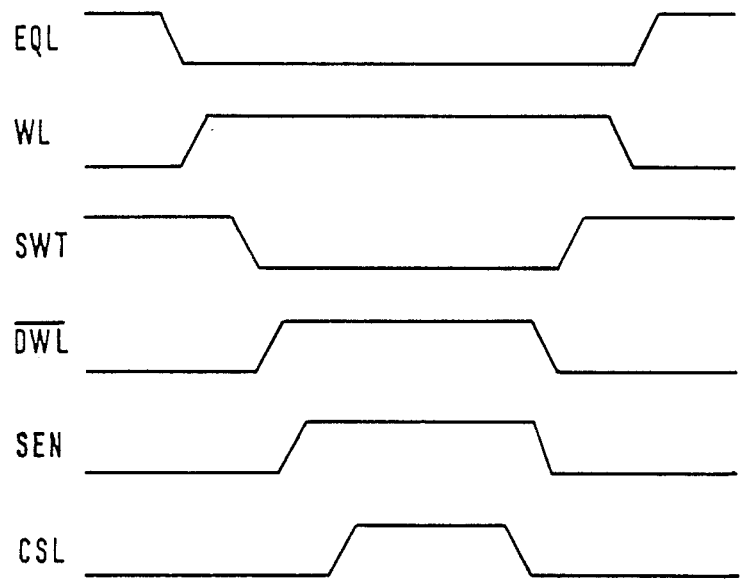
FIG. 6 is a timing chart showing the operation of the circuit diagram of the above embodiment.
FIG. 7 is a drawing showing input and output data of the circuit diagram of the above embodiment.

Similarly, depending on the potential stored in the memory cell 12, after amplification by the sense amplifiers SA1, SA2 and SA3, the sub-bit lines will have the levels shown in FIG. 7. This data is output to each of the data input/output I/O1, $\overline{I/O1}$, I/O2, $\overline{I/O2}$, I/O3 and $\overline{I/O3}$, and based on these data, two bits of data are output from the data output circuit shown in FIG. 4. For example, if I/O1 (BL1a) is low, $\overline{I/O1}$ ($\overline{BL1a}$) is high, I/O2 (BL1b) is low, $\overline{I/O2}$ ($\overline{BL1b}$) is high, I/O3 (BL1c) is low, and $\overline{I/O3}$ ($\overline{BL1c}$) is high, then the data D1 and D2 are both low level. The relation between the data on the sub-bit lines and the output data D1 and D2 is as shown in FIG. 7.

The reason that the value of the capacitor 31 of the dummy cell 13 is set to one third of that of the memory cell 12 is that when the potential read out from a memory cell 12 is transmitted to the three sub-bit lines, the electrical charge read out from the memory cell 12 will be divided into one third by the parasitic capacitance present on each of the three sub-bit lines. In other words, if the value of the capacitor 31 of the dummy cell 13 is set to one third of the memory cell, the potential difference can be amplified with approximately the same charge.

To begin the operation of writing data, after the completion of bit line precharging, two bits of write data are supplied from outside. Based on two bits of data D1 and D2, data to be supplied to the three pairs of data input/output lines I/O1, $\overline{I/O1}$, I/O2, $\overline{I/O2}$, I/O3 and $\overline{I/O3}$ is formed by the write circuit shown in FIG. 5. After this data has been supplied to the sense amplifiers SA1, SA2 and SA3, the data is supplied to the corresponding sub-bit lines by the sense amplifiers. At this point, each of the bit lines is separated by the transistors 11. Thereafter, the sense amplifiers SA are disabled, and the sub-bit lines are put in the floating state, and then the transistors 11 are made to conduct and the three sub-bit lines are connected together. By this means, the potential of the bit line BL is determined by a charge distribution due to the parasitic capacitance present in the three sub-bit lines, and this potential is written into the selected memory cell 12. For example, if of the two bits of data D1 is high and D2 is low, then data will be formed such that in the write circuit of FIG. 5 the sub-bit line BL1a is high level, and the sub-bit lines BL1b and BL1c are low level. Here if the values of the parasitic capacitance present in the three sub-bit lines BL1a, BL1b and BL1c are equal, then the high level voltage Vcc on the sub-bit line BL1a will be divided into three, so that the potential written into the memory cell 12 will be ($\frac{1}{3}$)Vcc. The re-writing operation after reading out is also done in the same way.

Thus, when reading out data from the memory cell 12, the sense amplifiers SA1, SA2 and SA3 are operated simultaneously, whereby almost the same high speed access times are attained as in a dynamic RAM using the conventional binary storage method. There is also the benefit that since it is not necessary to produce in a step-wise manner intermediate potentials corresponding to the potential to be stored in the memory cell in the bit line potential or word line potential, the control circuits have a simple structure.

Although the above embodiment has been described in terms of a case where a dummy cell 13 comprises one capacitor and transistor in the same way as the memory cell 12, other memory types may be adopted. Also the case has been described that an N channel transistor is used for the transistor 11, but in place of this N channel transistor may be used a P channel MOS transistor or CMOS transfer gate. If a P channel MOS transistor is used, when this is made conducting, the control signal SWT will be set to low level, and this low level potential is preferably set to be lower than the lowest level 0 of the bit line potential in order that the conduction resistance of the various transistors can be made sufficiently small.

Furthermore, in the case described above, a pair of data input/output lines I/O and $\overline{I/O}$ is provided for each of the sub-bit line pairs, but the construction may be such that there is a plurality of pairs of data input/output lines provided for each of the sub-bit line pairs. Furthermore, in the case described the bit line is precharged to a potential of $(\frac{1}{2})Vcc$, but this is not limited to this potential. Also, the case has been described that to each bit line pair is provided a corresponding independent load circuit, but these may be provided at one for each of the sub-bit line pairs.

The above described embodiment implements a dynamic RAM according to this invention with four values, but this invention is of course embodiable in a RAM using a multivalued storage method with a different number of values.

According to this invention as described above, a semiconductor memory having a multiple value storage method can be provided such that the same access times as in a conventional binary data storage method are obtained, circuit technology requiring complicated and highly accurate control is not necessary, and implementation is possible satisfactorily using established circuit technology from conventional semiconductor memories.

Various modifications can be made to the described embodiments without departing from the scope of the invention.

What is claimed is:

1. A semiconductor memory having a plurality of memory cells and a bit line connected to the memory cells, comprising:
   the bit line being formed of a plurality of sub-bit lines,
   switch means for interconnecting and disconnecting the sub-bit lines, said switch means including respective switching elements which interconnect the sub-bit lines,
   reference potential means for storing reference potentials, and
   sense amplifier means for comparing the output of an addressed memory cell with the reference potentials, whereby the memory is capable of storing n-valued data using n different storage potentials.

2. The semiconductor memory as claimed in claim 1, wherein each of the memory cells stores data for m bits where n equals $2^m$.

3. The semiconductor memory as claimed in claim 1, wherein each of the memory cells comprises a data storage capacitor and a selection transistor.

4. The semiconductor memory as claimed in claim 1, wherein the reference potential means comprises a plurality of dummy memory cells.

5. The semiconductor memory as claimed in claim 4, wherein each dummy memory cell comprises a data storage capacitor and a selection transistor.

6. The semiconductor memory as claimed in claim 1, wherein by data detection means connected to the sense amplifier means for outputting data as a data level which is the $(l+1)$th of the n-valued data when the potential of l sub-bit lines $(0 \leq l \leq (n-1))$ are each at a higher level than respective reference potentials.

7. The semiconductor memory as claimed in claim 1, also including data write means connected to the sense amplifier means for writing data to the memory cells by setting the potential of l sub-bit lines $(0 \leq l \leq (n-1))$ to a logic high level and the remainder of the sub-bit lines to a logic low level.

8. The semiconductor memory as claimed in claim 1, wherein the switching elements are formed of N channel MOS transistors, with the gate of the N channel MOS transistors being operably supplied with a higher potential than the high level potential of the sub-bit lines.

9. The semiconductor memory as claimed in claim 1, wherein the switching elements are formed of P channel MOS transistors with the gate of the P channel MOS transistors being operably supplied with a lower potential than the low level potential of the sub-bit lines.

10. The semiconductor memory as claimed in claim 1, wherein the switching elements are formed of CMOS transfer gates.

11. The semiconductor memory as claimed in claim 5, wherein the value of the capacitor of the dummy memory cells is set to be substantially $1/(n-1)$ of the value of capacitor of the memory cells.

12. The semiconductor memory as claimed in claim 4, wherein the dummy memory cells each produce a potential which is substantially $(k-0.5)/(n-1)$ of the maximum storage potential of the memory cells where k $(1 \leq k \leq (n-1))$ is an integer.

* * * * *